United States Patent
Yamauchi

(10) Patent No.: US 7,475,300 B2
(45) Date of Patent: Jan. 6, 2009

(54) TEST CIRCUIT AND TEST METHOD

(75) Inventor: Hisashi Yamauchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 369 days.

(21) Appl. No.: 11/480,455

(22) Filed: Jul. 5, 2006

(65) Prior Publication Data

US 2007/0033462 A1    Feb. 8, 2007

(30) Foreign Application Priority Data

Jul. 6, 2005    (JP)    ............... 2005-197061

(51) Int. Cl.
*G11C 29/00* (2006.01)
(52) U.S. Cl. .............. 714/719; 714/726; 714/729
(58) Field of Classification Search ........... 714/735, 714/727, 733, 718, 719, 726, 729

See application file for complete search history.

(56) References Cited

U.S. PATENT DOCUMENTS

| | | | | |
|---|---|---|---|---|
| 5,925,143 A | * | 7/1999 | Gillis et al. | 714/726 |
| 2003/0018939 A1 | * | 1/2003 | Kinoshita et al. | 714/742 |
| 2005/0235183 A1 | * | 10/2005 | Wang et al. | 714/726 |
| 2005/0235184 A1 | * | 10/2005 | Yamauchi | 714/726 |

FOREIGN PATENT DOCUMENTS

| | | |
|---|---|---|
| JP | 11-153650 | 6/1999 |
| JP | 2000-163995 | 6/2000 |

* cited by examiner

*Primary Examiner*—David Ton
(74) *Attorney, Agent, or Firm*—Young & Thompson

(57) ABSTRACT

A test method sets a write value to a scan flip-flop for setting a value to a memory to be tested. It then performs a series of shift operation in scan paths until setting of a read value is completed. During the shift operation, a value for refresh operation is added to the value passing through the flip-flop for setting a value to the memory to be tested.

16 Claims, 10 Drawing Sheets

| | F11 | F12 | F13 | F14 | F15 | F16 | F21 | F22 | F31 | F32 | F33 | F34 | F35 |
|---|---|---|---|---|---|---|---|---|---|---|---|---|---|
| SETTING 1 | 1 | X | 0 | 0 | 0 | 1 | X | X | X | X | X | X | X |
| SETTING 2 | X | X | 0 | 0 | 1 | 0 | X | X | X | X | X | X | X |

| | F11 | F12 | F13 | F14 | F15 | F16 | F21 | F22 | F31 | F32 | F33 | F34 | F35 |
|---|---|---|---|---|---|---|---|---|---|---|---|---|---|
| SETTING 1 | 1 | X | 0 | 0 | 0 | 1 | X | X | X | X | X | X | X |

WRITE SET VALUE

| | F11 | F12 | F13 | F14 | F15 | F16 | F21 | F22 | F31 | F32 | F33 | F34 | F35 |
|---|---|---|---|---|---|---|---|---|---|---|---|---|---|
| SETTING 2 | X | X | 0 | 0 | 1 | 0 | X | X | 0 | 0 | 1 | 0 | X |

READ SET VALUE     REFRESH SET VALUE

TEST CIRCUIT AND TEST METHOD

BACKGROUND OF THE INVENTION

1. Field of the Invention

The present invention generally relates to test circuits and test methods, and particularly relates to a test circuit and a test method for testing an integrated circuit with a memory.

2. Description of Related Art

A test technique that tests a memory or a circuit on a path passing through a memory in an integrated circuit using scan path is now widely used, as implemented into automatic test pattern generation program on a computer. However, this test technique assumes the use of static random access memory (SRAM) which does not require refreshing. It also assumes that reading is always available as long as read setting is set after writing.

A conventional memory test technique using scan path is described hereinafter with reference to FIG. 12. FIG. 12 is a set waveform used in a memory test of a related art. In FIG. 12, "SMC" indicates a value of a signal SMC for selecting whether to set a scan path to shift operation or normal operation without shifting, "SCANIN" indicates a value of scan input, and "SCANOUT" indicates a value of scan output.

In this example, the value of SMC is such that "1" represents "shift mode" and "0" represents "normal mode" when no shift occurs. The state different from the shift mode is "capture mode". Time t1 indicates when the mode changes from the shift mode to the capture mode. Time t2 indicates when the mode changes back from the capture mode to the shift mode. Time t3 indicates when the mode changes from the shift mode to the capture mode again after t2. Time t4 indicates when the mode changes back from the capture mode to the shift mode again after t3.

In FIG. 12, "X" represents "don't care" which means any value may be set to an input and an output is not checked. "Write setting" represents setting of a scan input value for write setting on a memory included in a circuit to be tested. Specifically, the value of a scan input which is input by the Write setting reaches a flip-flop for setting the memory at Time t1 and memory write setting is made at that time.

"Read setting" represents setting of a scan input value for read setting on a memory included in a circuit to be tested. Specifically, the value of a scan input which is input by the Read setting reaches a flip-flop for setting the memory at Time t3 and memory read setting is made at that time. "Read value output" represents output of a read value designated by the memory read setting made by the Read setting. A series of test is thereby performed.

FIG. 12 shows the case of performing reading after one-time scan shift following write setting by way of example. There is a case of performing one test target after three or more times of scan shift, in which case a retention period that a dynamic random access memory (DRAM) holds a value becomes longer, thus deteriorating the conditions under a conventional technique. FIG. 12 illustrates an optimal case that tests one test target after a plurality of times of scan shift by a conventional technique.

When performing write delay test on a memory or a circuit on a path passing through a memory using scan path, the process performs immediately preceding write setting in a cycle immediately before t1, which is normally one cycle before t1, and performs write setting at t1. When performing read delay test, the process performs immediately preceding read setting in a cycle immediately before t3, which is normally one cycle before t3, and performs read setting at t3. The Write setting and Read setting represent a series of settings on writing and a series of settings on reading, respectively.

The application of the above memory test technique to DRAM raises the following problems. First problem is that, if a time period from the write setting to the read setting is longer than a data retention period or a refresh period of DRAM, it is unable to implement testing.

Another problem is an increase in load on automatic test pattern generation. Generally, the automatic test pattern generation determines a value for writing to DRAM in a series of write operation and a value for reading from DRAM in a series of read operation. No problem occurs if a refresh period of DRAM is longer than a time period for one-time shift operation of scan path, and a test can be performed by one-time write operation and one-time read operation.

However, there are cases where a plurality of write operation is needed for one test. One example is when generating a test pattern for detecting a circuit error relating to an address. In such a case, it is necessary to write different values to a write and read target address which is selected when no error exists in a circuit and to a write and read target address which is selected when an error relating to an address exists in a circuit. Then, a test is performed by reading the value that is written to the write and read target address which is selected when no error exists in a circuit. This process requires a plurality of times of write operation settings.

In this case, scan shift is performed a plurality of times before the value is read during the first write setting in a plurality of times of write settings. Therefore, it is necessary in some cases to replace a part of the second and subsequent write settings determined by the automatic test pattern generation with refresh setting and determine the set value of the test pattern again. It thus increases load on the automatic test pattern generation with regard to refresh operation, Further, Japanese Unexamined Patent Publications Nos. 11-153650 and 2000-163995 disclose the test circuit and test method for DRAM using scan path. However, these patent documents only describe the method and circuit for performing write setting or read wetting on DRAM and do not describe a test method and test circuit which takes the restriction of a data retention period of DRAM into account.

As described in the foregoing, the present invention has recognized that conventional test methods have a problem that it is unable to implement testing when a time period from write setting to read setting is longer than a data retention period of DRAM or a refresh period.

SUMMARY OF THE INVENTION

According to an aspect of the present invention, there is provided a test method for writing and reading on a memory to be tested through a scan path flip-flop, which includes writing data to the memory from outside by inputting a write set value to the scan path flip-flop, refreshing the data written to the memory by inputting a refresh set value to the scan path flip-flop, and reading the data from the memory and outputting the data to the outside by inputting a read set value to the scan path flip-flop. This method enables implementation of memory test while refreshing the memory efficiently.

According to an aspect of the present invention, there is provided a test circuit for performing testing by shift operation of a plurality of scan paths including a memory test scan path for testing a memory, which includes a plurality of flip-flops included in each of the plurality of scan paths, wherein the number of flip-flops included in the memory test scan path is half or less than half of a largest number of flip-flips included in the scan paths. This configuration allows performing shift operation of the memory test scan path a plurality of times while performing shift operation of the scan paths different from the memory test scan path once, thereby enabling implementation of memory test while refreshing the memory efficiently.

According to an aspect of the present invention, there is provided a test circuit for performing testing by shift operation of a plurality of scan paths including a memory test scan path for testing a memory, which includes performing shift operation of the memory test scan path a plurality of times while performing shift operation of the scan paths different from the memory test scan path once, and refreshing the memory by at least one time of shift operation of the plurality of times of shift operation. This configuration enables implementation of memory test while refreshing the memory efficiently.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
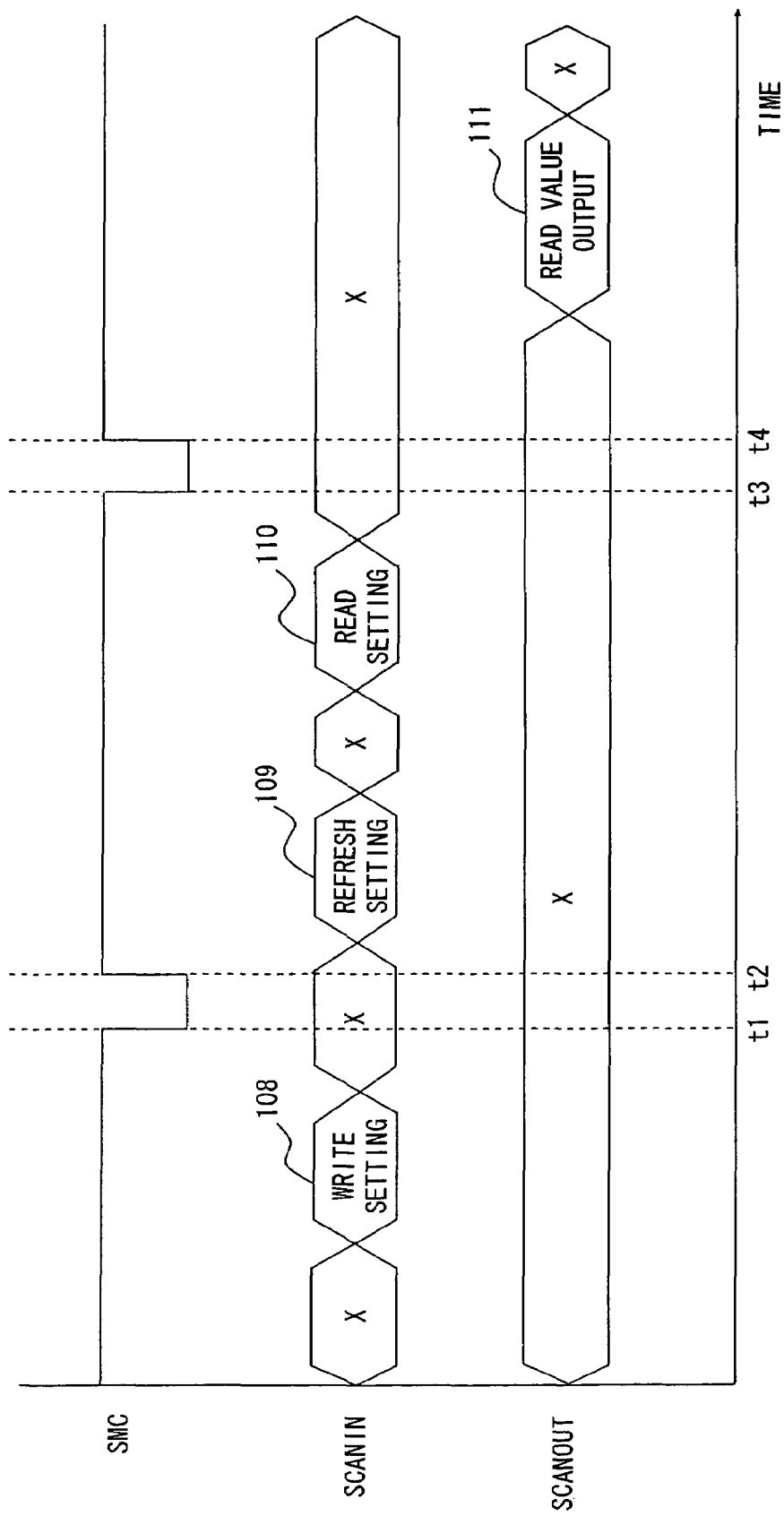
FIG. 1 is a set waveform for testing DRAM according to a first embodiment of the present invention.

A test circuit according to an embodiment of the invention is described hereinafter with reference to FIG. 1. The test circuit according to this invention is adapted to a monolithic semiconductor device equipped with DRAM. In FIG. 1, "SMC" indicates a value of a signal SMC for selecting whether to set a scan path to shift operation or normal operation without shifting, "SCANIN" indicates a value of a scan input, and "SCANOUT" indicates a value of a scan output. In this embodiment, the value of SMC is such that "1" represents shift mode and "0" represents normal mode when no shift occurs. The state different from the shift mode is called capture mode.

Time t1 indicates when the mode changes from the shift mode to the capture mode. Time t2 indicates when the mode changes from the capture mode to the shift mode for the time firstly after t1. Time t3 indicates when the mode changes from the shift mode to the capture mode again after t2. Time t4 indicates when the mode changes back from the capture mode to the shift mode again after t3.

In FIG. 1, "X" represents "don't care" which means any value may be set to an input and an output is not checked. Write setting 108 in FIG. 1 represents setting of a scan input value for write setting on a memory included in a circuit to be tested. Specifically, the value of a scan input which is input by the Write setting 108 reaches a flip-flop for setting a memory at Time t1, and memory write setting is performed at that time.

Read setting 110 in FIG. 1 represents setting of a scan input value for read setting on a memory included in a circuit to be tested. Specifically, the value of a scan input which is input by the Read setting 110 reaches a flip-flop for setting a memory at Time t3, and memory read setting is performed at that time. Read value output 111 in FIG. 1 represents output of a read value designated by the memory read setting made by the Read setting 110. This embodiment is different from the technique shown in FIG. 12 in that Refresh setting 109 is added.

In the Read setting 110, a read value is input at Time t3 to a register for setting DRAM. On the other hand, the refresh setting is performed not at Time t3 but precedently at the timing of the Refresh setting 109 on a value which passes through the register for setting DRAM. In this way, a first test method of the present invention adds the operation of Refresh setting during the shift operation of scan path from writing of a value to DRAM to reading of the written value from DRAM by a series of read operation.

Figure 4:
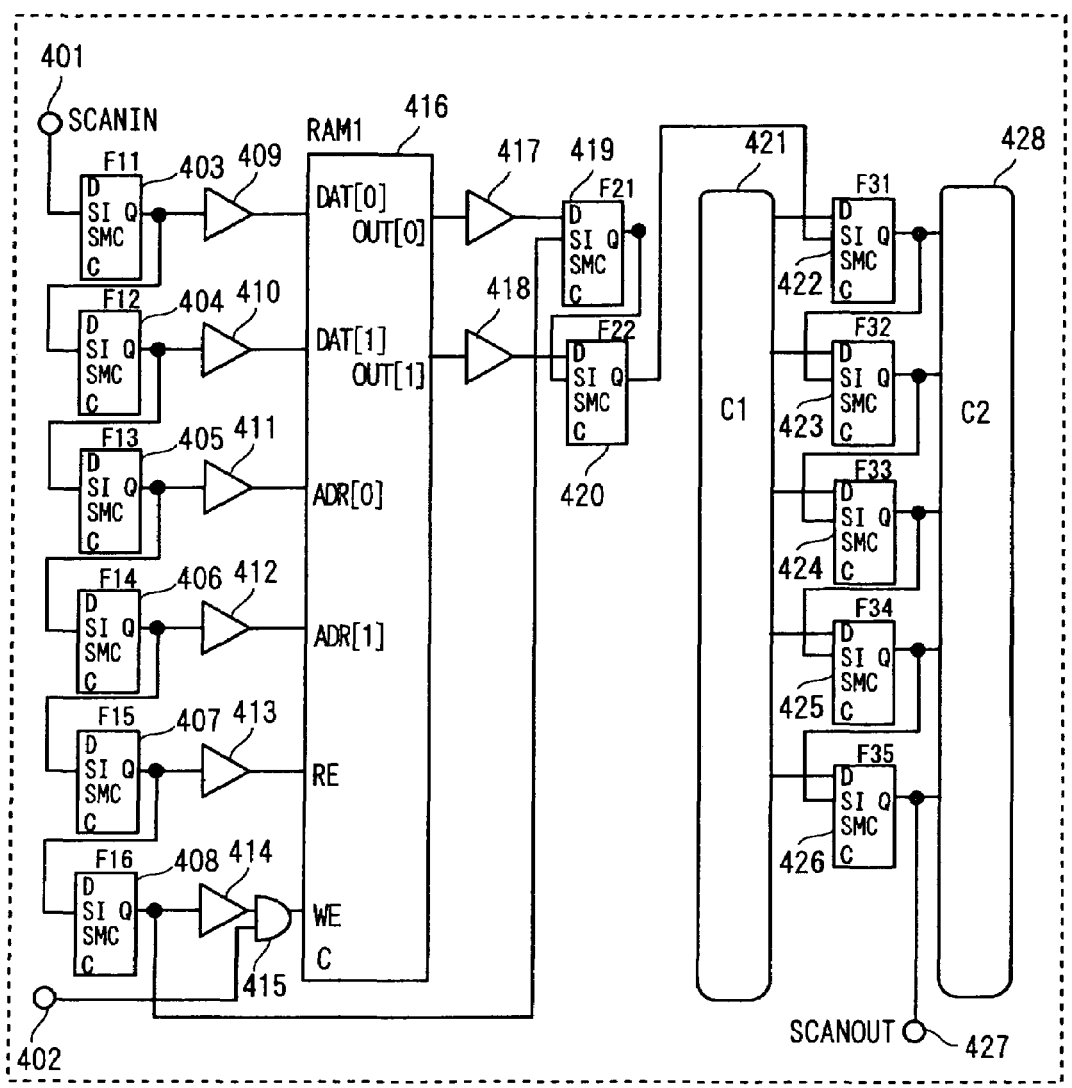
FIG. 4 is a circuit diagram to describe application of the first embodiment of the present invention.

The configuration of a test circuit according to an embodiment of the present invention is described herein. FIG. 4 shows a test circuit according to this embodiment. The test circuit 4 includes a scan input terminal 401, an external control terminal 402, flip-flops 403 to 408, buffers 409 to 414, an AND gate 415, a DRAM 416, buffers 417 to 418, flip-flops 419 to 420, a circuit 421, flip-flops 422 to 426, a scan output terminal 427, and a circuit 428. The signals that are not related to a shift path of scan path, a path for setting a value to DRAM and a path for checking a value from DRAM are not illustrated in FIG. 4.

The scan input terminal 401 is a terminal for inputting data to the flip-flop 403. The external control terminal 402 is a terminal for inputting data from outside to the DRAM 416 through the AND gate 415 to thereby control write enable of the DRAM 416.

The flip-flops 403 and 404 set data inputs. The flip-flops 405 and 406 set addresses. The flip-flop 407 sets read enable that designates reading. The flip-flop 408 sets write enable that designates writing. An enable value of read enable for the DRAM 416 is 1, and an enable value of write enable for the DRAM 416 is also 1.

The AND gate 415 calculates logical AND of the data from the external control terminal 402 and the data from the buffer 414 and outputs the result to the DRAM 416.

The DRAM 416 is a DRAM to be tested. The input terminal of the DRAM 416 is described below. The terminal DAT[0] indicates 0th bit of data input and the terminal DAT[1] indicates 1st bit of data input. The terminal ADR[0] indicates 0th bit of address input, and the terminal ADR[1] indicates 1st bit of address input. The terminal RE indicates read enable, and the terminal WE indicates write enable. The terminal OUT[0] indicates 0th bit of output data, and the terminal OUT[1] indicates 1st bit of output data. C indicates clock input. It is assumed that the same clock as the one for flip-flops is connected, and the connection is not illustrated in the figure.

The flip-flops 419 and 420 hold data that is output from the DRAM 416. The circuit 421 is not directly related to the setting of DRAM.

The output terminal 427 is a terminal for outputting output data from the DRAM 416. The circuit 428 is not directly related to the setting of DRAM.

For simplification of description, the circuits which are related to setting or checking of the DRAM 416, other than the flip-flops of the scan path, are configured as the buffers such as the buffers 409 to 414, 417 and 418 except for the AND gate 415 in this embodiment. However, the circuits which are related to setting or checking of the DRAM 416 may be configured in different circuits. The following process flow applies to this case as well, though setting of a plurality of values to flip-flops may be needed for one terminal of DRAM.

Figure 12:
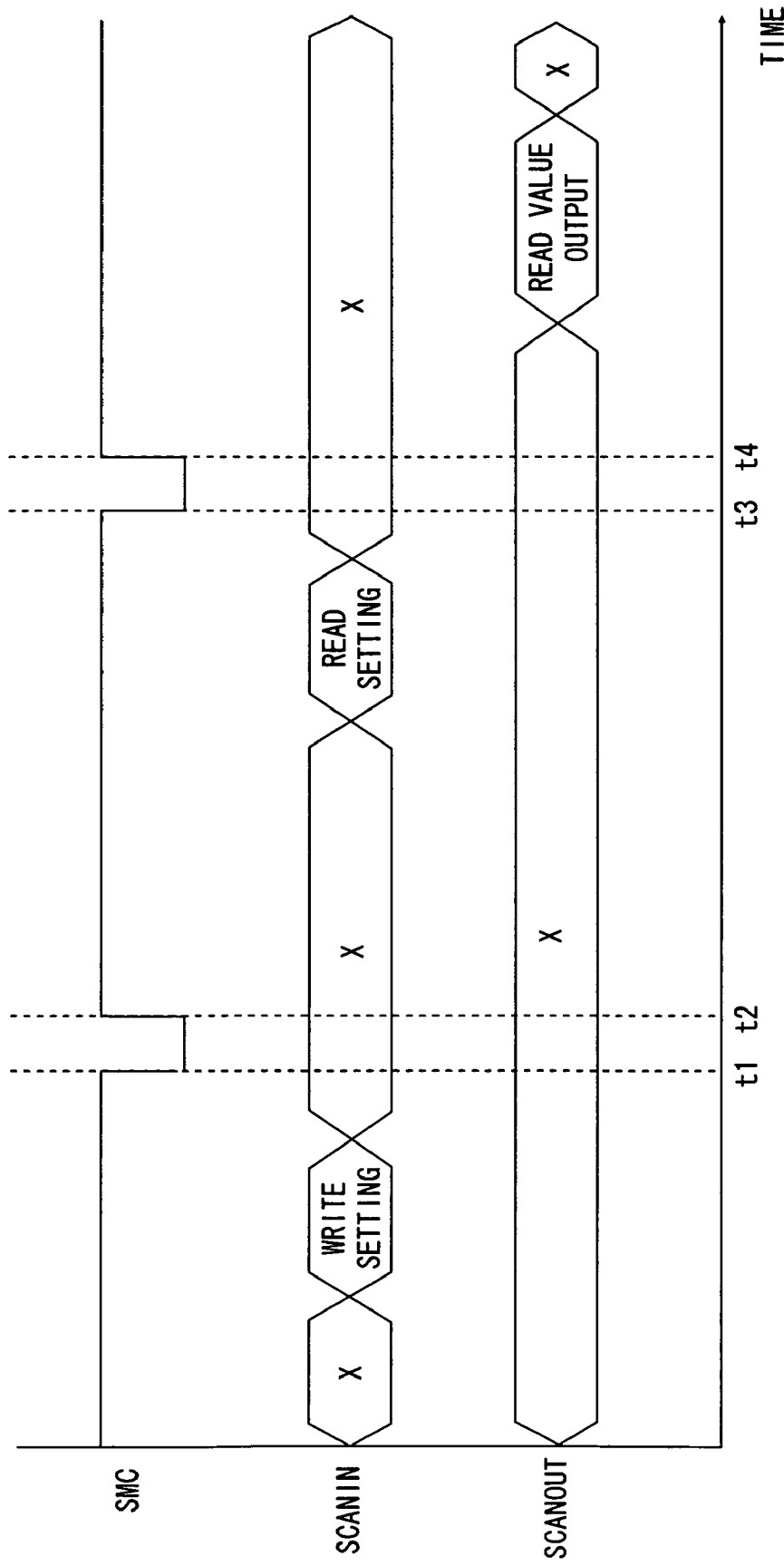
FIG. 12 is a set waveform for testing a conventional memory.

In this circuit, the relationship between a data retention period of the DRAM 416 and an operating frequency of scan shift is such that the data retention period of the DRAM 416 corresponds to ten cycles of scan shift. When there is no restriction in data retention period of the DRAM 416, if the value of the DRAM 416 is not rewritten after write setting, read setting can be performed after one scan shift as shown in FIG. 12.

In the circuit of FIG. 4, if the value input through the external control terminal 402 is set to "0" after writing, the output value of the AND gate 415 stays 0 without being rewritten regardless of the value that is output from the flip-flop 408. When performing read setting, a value to be input to the scan input terminal 401 at scan in may be determined so that "1" is set to the flip-flop 407 and a desired read address is set to the flip-flops 405 and 406 during the capture cycle.

The detailed description is given below with specific values. The case of generating a test pattern for detecting stuck-at-0 fault occurring in the terminal DATA[0] is described as an example. In order to detect stuck-at-0 fault, which is an error that a value is fixed to "0", occurring in the terminal DATA[0], the process writes DATA[0]=1 to the address 0 with ADR [1]=0 and ADR [0]=0 and then reads data from the address 0 with ADR[1]=0 and ADR[0]=0, thereby performing test.

Figure 5:
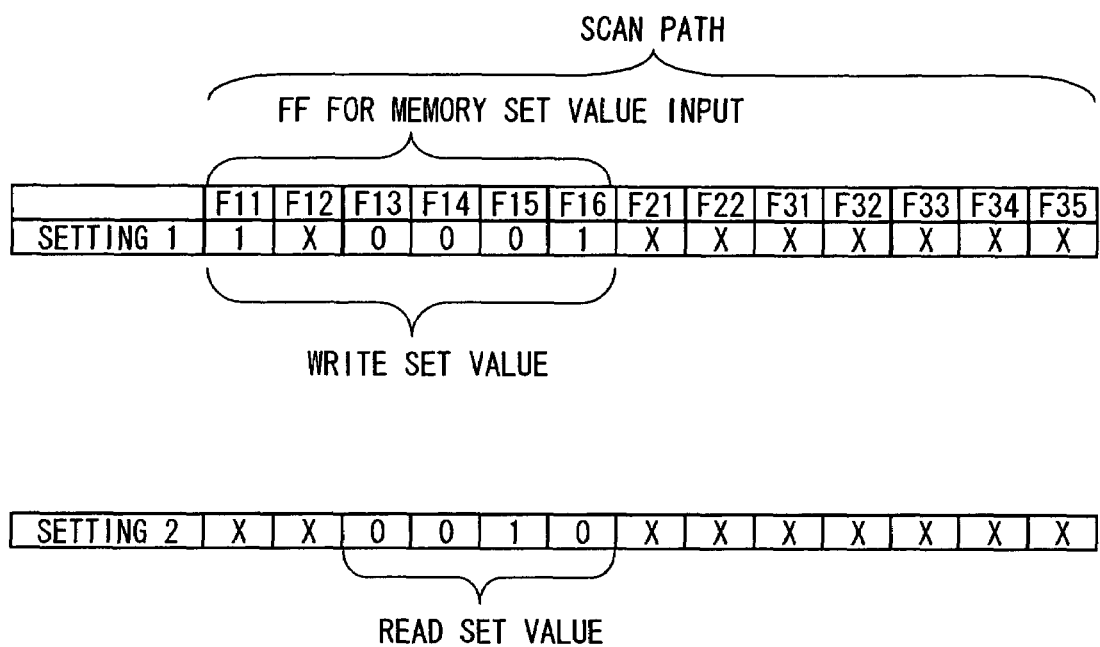
FIG. 5 is a first view showing one stage of test pattern setting in a circuit of FIG. 4 according to an embodiment of the invention.

In order to prevent a write value from changing during shift operation, the value input through the external control terminal 402 is "0" during shirt operation and "1" during capture mode. FIG. 5 shows the settings of the flip-flops when there is no restriction in a retention period of the DRAM 416. In FIG. 5, the setting 1 shows write setting and the setting 2 shows read setting, each showing the values of the flip-flops at the first time point during the capture mode. Referring also to FIG. 12, the setting 1 in FIG. 5 shows the values of the flip-flops at Time t1 in FIG. 12, and the setting 2 shows the values of the flip-flops at Time t3.

In FIG. 5, "X" indicates "don't care", which means any value may be set. During writing, the process sets "1" to the input of DAT[0], designates address 0, sets "1" to write enable and "0" to read enable. During reading, on the other hand, the process designates address 0, sets "0" to write enable and "1" to read enable.

If the DRAM 416 is a synchronous DRAM that is synchronized with the clock of flip-flops, when a clock is applied once after the setting 2, an output value from the address 0 is supplied to the terminals OUT[0] and OUT[1]. When another clock is applied, the output value of the DRAM 416 is captured into the flip-flops 419 and 420. The mode of the scan path is then changed to shift mode to shift data, thereby enabling checking of the output value of the DRAM at the scan output terminal 427. The value which is once captured into the flip-flops can be checked regardless of a retention period of the DRAM 416, and the setting for checking of the output value is not described herein.

FIG. 5 shows the set values as values of flip-flops at the first time point in the capture mode. The set values can be expressed as values which are supplied to the scan input terminal 401 as in FIG. 12 in the following way. The flip-flops on a scan path are connected in the order of F35, F34, F33, F32, F31, F22, F21, F16, F15, F14, F13, F12 and F11, as denoted in FIG. 4, from the side closer to the scan output terminal 427. In FIG. 5, the flip-flops are arranged sequentially in the same order from the right side. The flip-flops F11 to F16 are first flip-flops for setting a memory, and the flip-flops F21 to F35 are second flip-flops for setting another circuit.

A value to be set to the flip-flop which is closer to the scan output terminal 427 is input precedently through the scan input terminal 401. Thus, in write setting, the values of the setting 1 are input sequentially from the right, X, X, X, X, X, X, X, 1, 0, 0, 0, X, 1, for each cycle from the start of shift operation in scan path. The value of X may be either 0 or 1.

In the read setting after performing the write setting, the values of the setting 2 are input sequentially from the right, X, X, X, X, X, X, X, 0, 1, 0, 0, X, X, for each cycle from the start of shift operation in scan path. Referring to both FIG. 5 and FIG. 12, the Write setting in FIG. 12 corresponds to the setting of write set values F16, F15, F14, F13, F12 and F11 in the settings 1 in FIG. 5, and the Read setting in FIG. 12 corresponds to the setting of read set values F16, F15, F14 and F13 in the settings 2 in FIG. 5. If there is no restriction in data retention period, like the case of using SRAM, it is possible to perform test with the settings shown in FIG. 5.

Figures 6, 7:
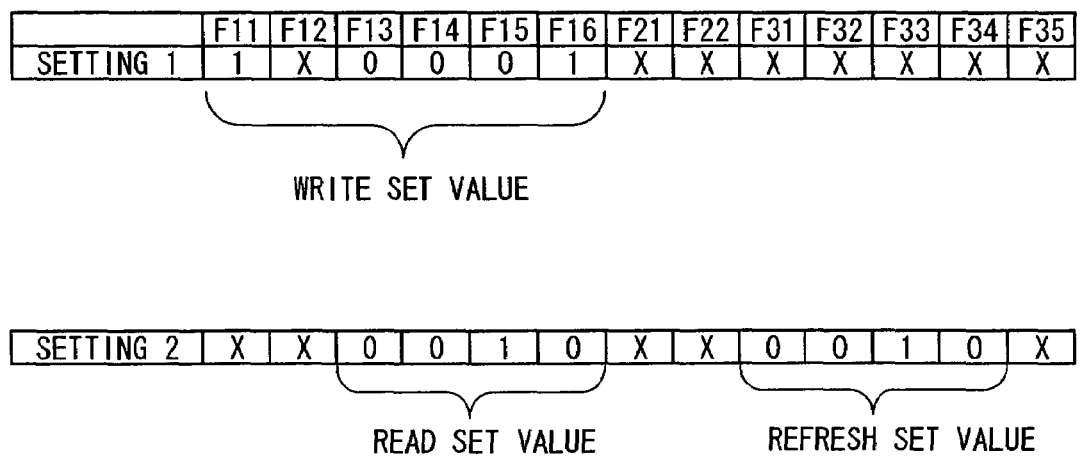
FIG. 6 is a second view showing one stage of test pattern setting in a circuit of FIG. 4 according to an embodiment of the invention.
FIG. 7 is a third view showing one stage of test pattern setting in a circuit of FIG. 4 according to an embodiment of the invention.

However, a test target in FIG. 4 is DRAM, and a data retention period is assumed to be ten clock cycles during shifting. Thus, the configuration of FIG. 5 which requires thirteen clock cycles from the write setting to the read setting has a risk of loss of written data, and it is impossible to perform test normally. To overcome this drawback, the refresh setting 109 is performed before the read setting 110 as shown in FIG. 1 so as to prevent data loss and complete test normally. FIG. 7 shows an example of this setting.

Figures 8, 9:
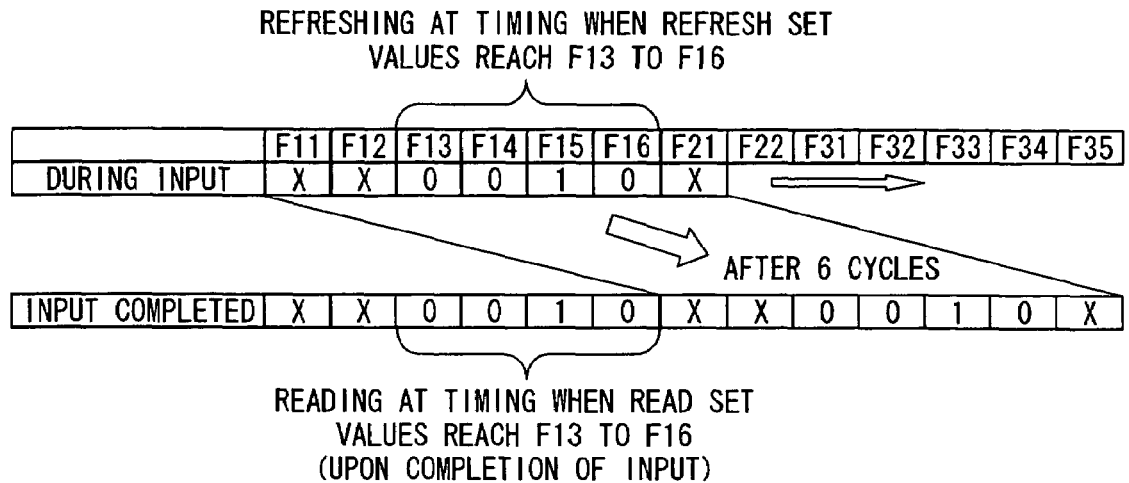
FIG. 8 is a fourth view showing one stage of test pattern setting in a circuit of FIG. 4 according to an embodiment of the invention.
FIG. 9 is a fifth view showing one stage of test pattern setting in a circuit of FIG. 4 according to an embodiment of the invention.

DRAM with refresh mode can implement refreshing simply by setting refresh mode. DRAM without refresh mode can also implement refreshing by configuring the read setting to the address that holds a value. In the read setting which is performed only for refreshing, there is no need to capture the read value to flip-flops; there is only need to make a read state for just one cycle. This state is shown in FIG. 8 as "during input".

The setting 2 in FIG. 7 shows the values of the flip-flops at the first time point in the capture mode during read setting, which is Time t3 in FIG. 1. The values set to the flip-flops F34, F33, F32, and F31 are refresh set values for configuring read setting to implement refreshing. The flip-flops to make the read setting are F16, F15, F14 and F13. The refresh set values shown in F34, F33, F32, and F31 in the setting 2 in FIG. 7 are set to the flip-flops F16, F15, F14 and F13 at six cycles before Time t3. These values pass through these flip-flops and reach the flip-flops F34, F33, F32, and F31 at Time t3. The time point that is six cycles before t3 is the time point that is seven cycles after t2. Thus, the setting 2 in FIG. 7 satisfies the condition that it is necessary to perform refreshing within ten cycles from t2.

Figure 3:
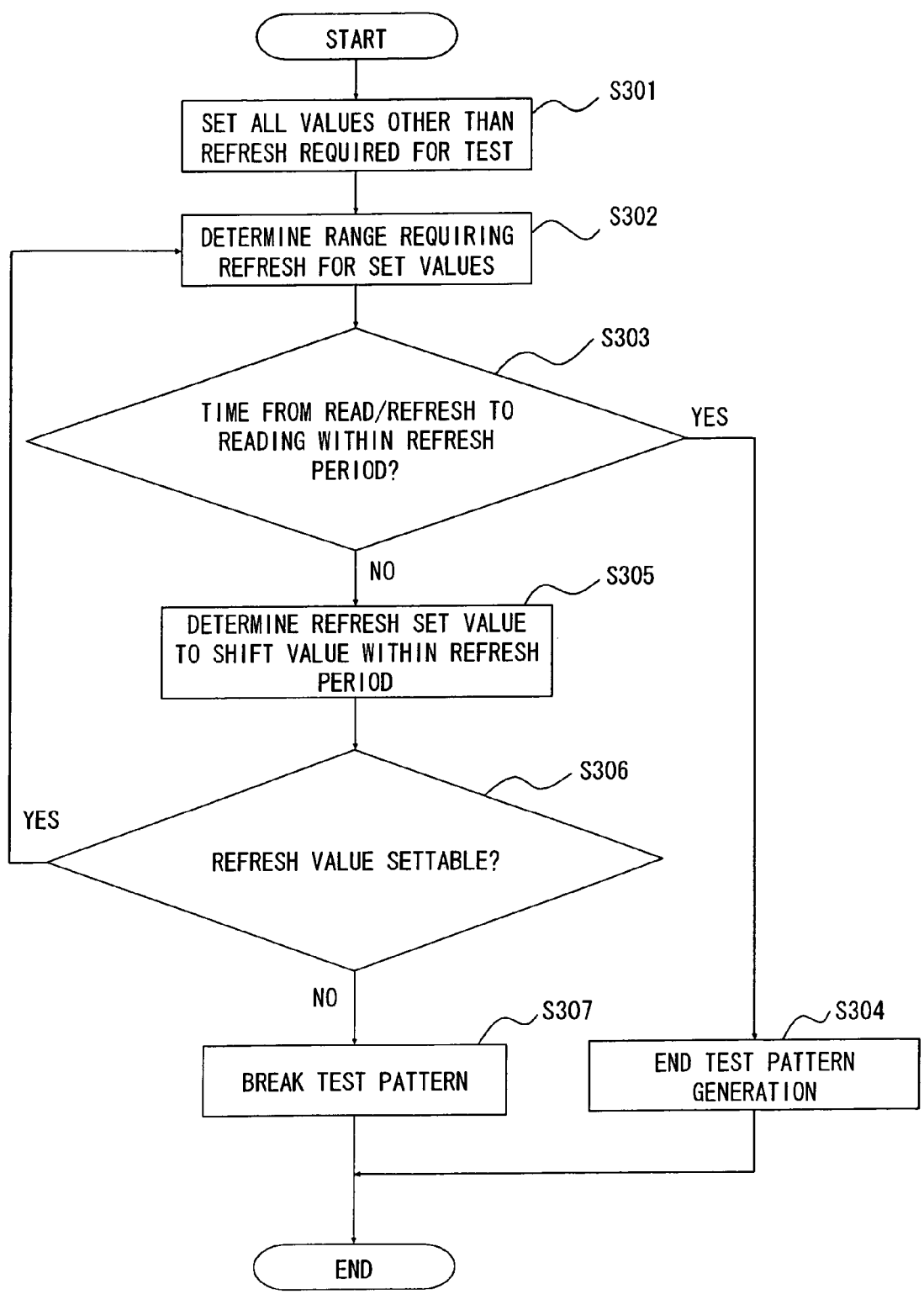
FIG. 3 is a flowchart showing the way of setting a test pattern according to the first embodiment of the present invention.

The process flow for implementing the scan path test technique on DRAM shown in FIG. 1 is described hereinafter with reference to the flowchart of FIG. 3.

First, a test pattern is generated by a normal test pattern generation method without regard for refreshing, just like the test pattern generation on SRAM (S301). Then, a time range which requires refreshing is determined for the setting in need of refreshing in the set values obtained by the above test pattern generation (S302). When determining a time range which requires refreshing first, the process adds a refresh time period to a set time period of a write value that is set by the test pattern generation to thereby determine a time range which requires refreshing.

After that, it is determined whether reading is performed after writing within a refresh time period (S303) If reading is performed within the refresh time period, there is no need to make refresh setting, and the process stores the obtained setting as a test pattern and ends the test pattern generation (S304). If, on the other hand, reading is not performed within the refresh time period, the process determines a refresh value in a shift value within the refresh time period (S305).

The process then determines whether the determined refresh set value is settable without conflict with already set values such as read setting (S306). If it is determined that the refresh value is not settable, it means that test pattern generation is impossible and thus the process breaks the test pattern and ends the operation (S307) If, on the other hand, it is determined that the refresh value is settable, the process determines the range of time which requires refreshing next, starting at the set refresh time point. At this time, it is determined whether the refresh period is not from the first write setting to reading but from the refresh setting that is performed subsequently to reading. The above-described process is repeated after that.

A test pattern generation method when applying the flowchart of FIG. 3 to the circuit of FIG. 4 is described hereinafter with reference to FIGS. 5 to 9. The case of generating a test pattern for detecting stuck-at-0 fault in DAT[0] of the DRAM 416 in FIG. 4 is described as an example.

FIGS. 5 to 9 show set values to the flip-flops in the circuit of FIG. 4. The setting 1 shows input values in write setting, and the setting 2 shows input values in read setting. The input values in the setting 1 are values set to the flip-flops at t1 in FIG. 1, and the input values in the setting 2 are values set to the flip-flops at t3 in FIG. 1. Thus, upon completion of shift operation, the write set values shown in F11 to F16 are the set values to be input to the DRAM 416. The values set to F11 to F16 at six cycles before the completion of shift operation correspond to the values shown from F21 to F34 in FIGS. 5 to 9.

Stated in a different way, the values shown in F21 to F34 are set to the flip-flops F11 to F16 at six cycles before the completion of shift operation, then shifted for the six cycles, and consequently set to the flip-flops F21 to F34 at the completion of shift operation.

FIG. 5 shows the set values which are obtained as a result of normal test pattern generation, assuming the DRAM 416 to be SRAM which does not require refreshing. This setting is the same as the above-described setting. It is assumed herein that a data retention period or a refresh period is ten clock cycles during shift operation. The values in the setting 2 are such that the set value at the first cycle after the start of shifting is the value shown in F35, and the set value at the second cycle after the start of shifting is the value shown in F34. Therefore, the read setting or refresh setting should be completed within the range of F14 to F35 in FIG. 6.

The process of determining the range of time which requires refreshing is equivalent with the process of determining the range of F14 to F35 in FIG. 6. However, all settings should be within the range of F14 to F35 in FIG. 6, taking account of the shift of F11 and F12 which are irrelevant with read setting. Thus, as for the setting of F13, F14, F15 and F16, the setting should be completed within eight cycles, which are F35, F34, F33, F32, F31, F22, F21 and F16.

After that, it is determined whether the read setting or refresh setting is completed within this range. Since the read setting is not completed in the range of F14 to F35 in FIG. 6 in this case, the refresh setting is set to the value during shifting. As described above, the refresh setting can be performed by setting the read setting for a target address. Thus, the values 0, 0, 1, 0 are respectively input to F13, F14, F15 and F16 so that they are set during shifting.

In FIG. 7, the values set to F13, F14, F15 and F16 at seven cycles after the start of shifting in the setting 2 are respectively shown in F31, F32, F33 and F34. Thus, the setting of FIG. 7 causes refreshing at seven cycles after the start of shifting in the setting 2 and then reading to be performed.

Since the refresh value is set to "X" or "don't care" in the read setting of the setting 2 in FIG. 5, it dose not conflict with the read setting. Thus, the determination whether the refresh value is settable results in "settable", and the process proceeds to the step of determining a range which requires refreshing.

In the process of determining a range which requires refreshing, in order to determine a range which further requires refreshing in addition to the refresh setting set in FIG. 7, a data retention period after the refresh setting in FIG. 7 is obtained. This range is F11 to F16 in FIG. 7.

Then, the process proceeds to the step of determining whether the read setting is performed within the refresh period or not. Since the read setting is performed within the refresh period in this case, the test pattern setting ends, and the setting determined in the above process as in FIG. 8 or 7 is registered as a test pattern for detecting stuck-at-0 fault in DAT[0] of the DRAM 416 of FIG. 4. The test pattern generation thereby ends.

However, the test pattern for detecting stuck-at-0 fault in DAT[0] of the DRAM 416 is not just one pattern as shown in FIG. 7. For example, the fault is detectable with the setting as shown in FIG. 9. The refresh setting in this case is performed with the values shown in F16, F21, F22 and F31 in the setting 2. These values respectively reach F13, F14, F15 and F16 at ten cycles after the start of shifting.

The read setting without regard for refreshing in FIG. 5 are made with the use of the values set to F13, F14, F15 and F16, and the setting for refreshing shown in FIG. 9 also requires the refresh set value set to F16. For F16, the set value required for read setting is 0 and the set value required for refresh setting is also 0; thus, no conflict exists and it is usable as a test pattern.

In this way, this embodiment enables refreshing process to be performed between memory writing and memory reading.

Though the refresh set value is set to an input value in the setting 2 for memory reading in the above example, the refresh set value may be set to an input value in the setting 1 for memory writing depending on the configuration of the flip-flops. If the input values of the setting 1 and the setting 2 are input in succession, the input values may be set so that the refresh set value is input so as to overlap with the both input values.

Second Embodiment

Figure 2:
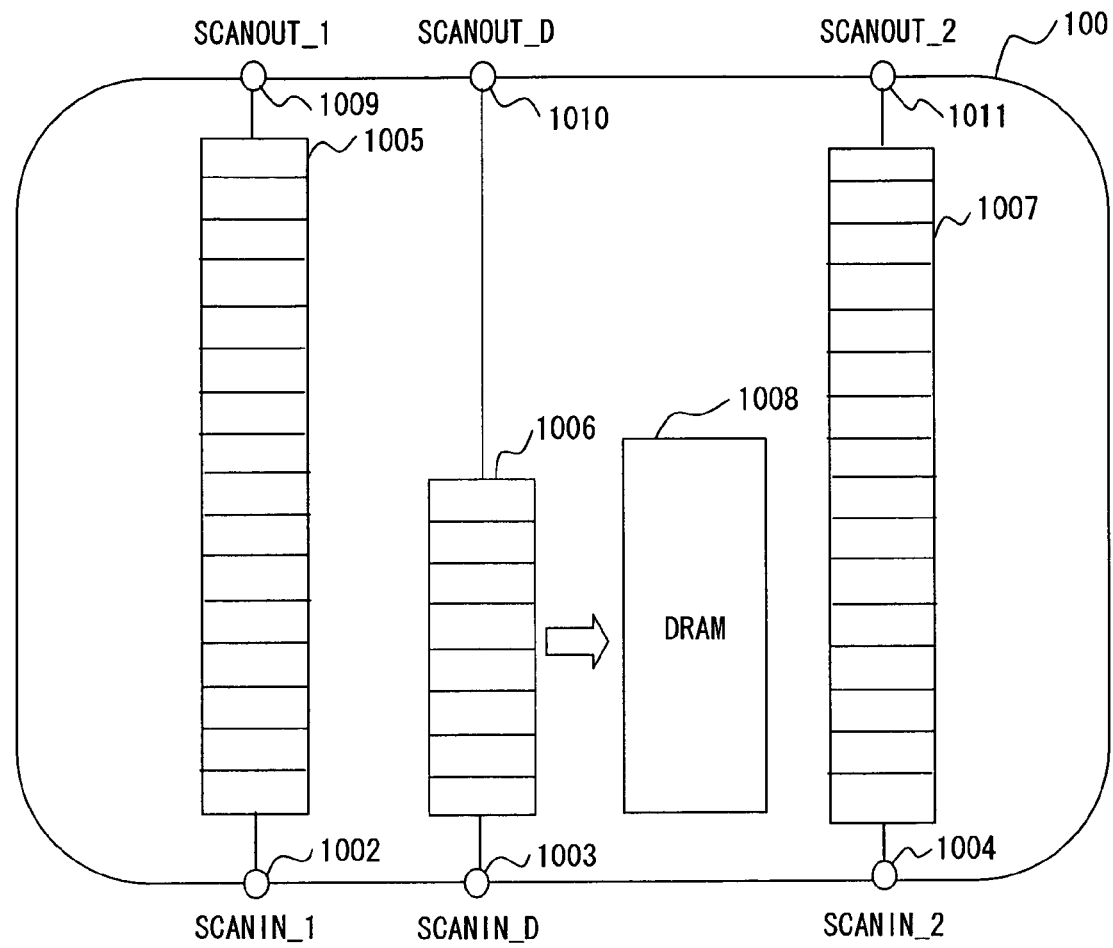
FIG. 2 is a circuit diagram showing a second embodiment of the present invention.

A second embodiment of the present invention is described hereinafter with reference to FIG. 2. The test circuit according to this invention is adapted to a monolithic semiconductor device equipped with DRAM. FIG. 2 shows the configuration of a test circuit according to the second embodiment of the invention. The test circuit 100 includes scan input terminals 1002, 1003 and 1004, flip-flop groups 1005, 1006 and 1007, DRAM 1008, and scan output terminals 1009, 1010 and 1011.

The test circuit 100 is composed of three scan paths. The flip-flops for setting the DRAM 1008 are included only in the scan path SCAN_D which receives a scan input through the scan input terminal 1003, outputs a scan output through the scan output terminal 1010, and has the flip-flop group 1006 to form the scan path.

The other scan paths are SCAN_1 which is composed of the scan input 1002, the flip-flop group 1005 and the scan output 1009 and SCAN_2 which is composed of the scan input 1004, the flip-flop group 1007 and the scan output 1011. However, SCAN_1 and SCAN_2 are not directly related to the setting of the DRAM 1008.

The number of flip-flops which are included in the scan path for setting the DRAM 1008 is half or less than half of the number of flip-flops which are included in the scan path having the largest number of flip-flops. In the example of FIG. 2, the number of flip-flops included in SCAN_D is half the number of flip-flops included in SCAN_1 and SCAN_2.

In a normal scan path test, the number of shift cycles of the scan path equals the number of flip-flops in the scan path having the largest number of flip-flops. Therefore, if the scan path includes half or less than half the number of flip-flops included in the scan path having the largest number of flip-flops, it is possible to perform shift operation at least twice on the scan path which is related to the setting of the DRAM 1008 while performing shift operation once on the other scan path. The configuration of the scan path enables scan path test on the DRAM 1008 by setting a test pattern for normal SRAM in the second-time shift operation and setting refresh operation in the first-time shift operation.

Figure 10:
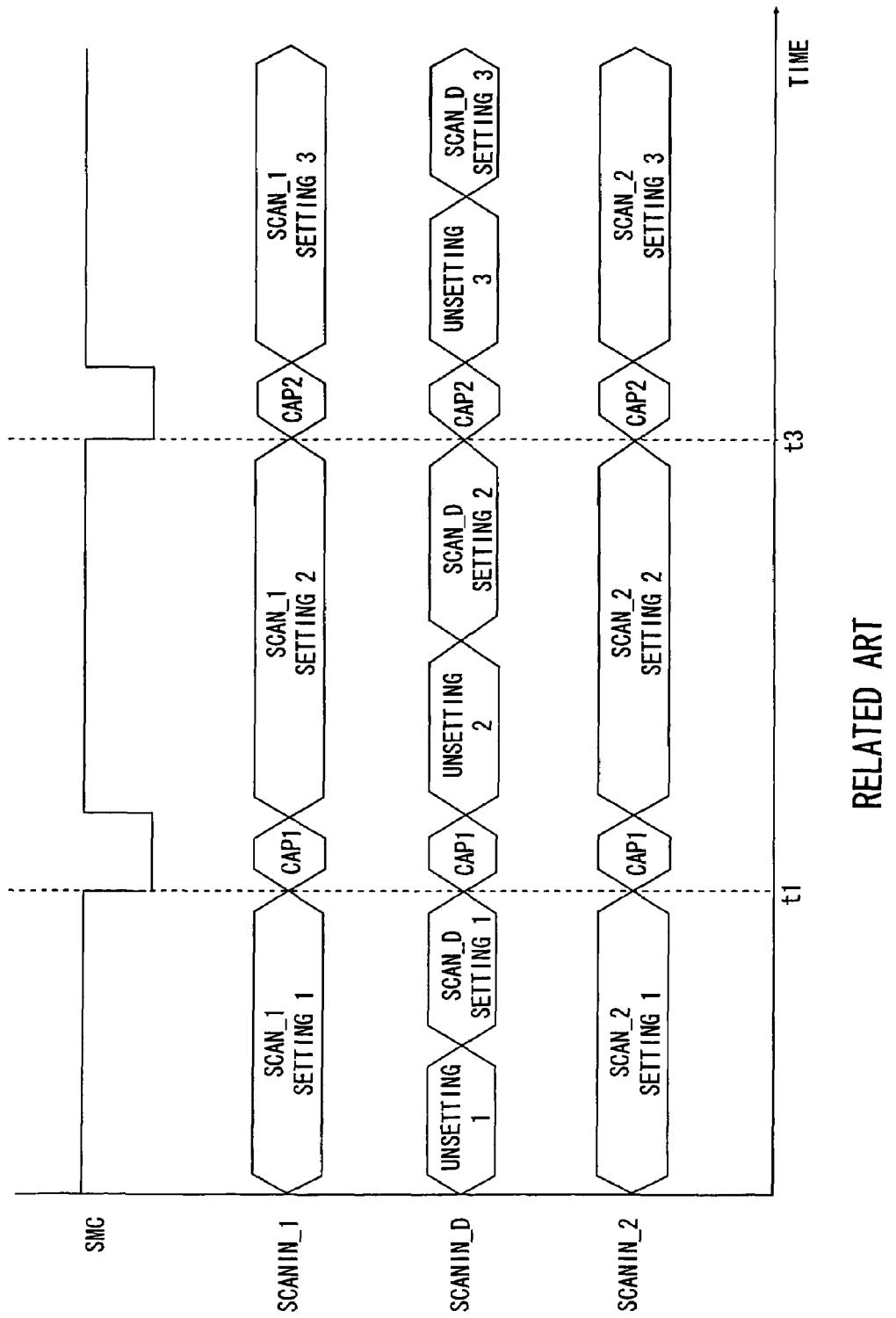
FIG. 10 is a view showing test pattern setting in a circuit of FIG. 2 according to a related art.
Figure 11:
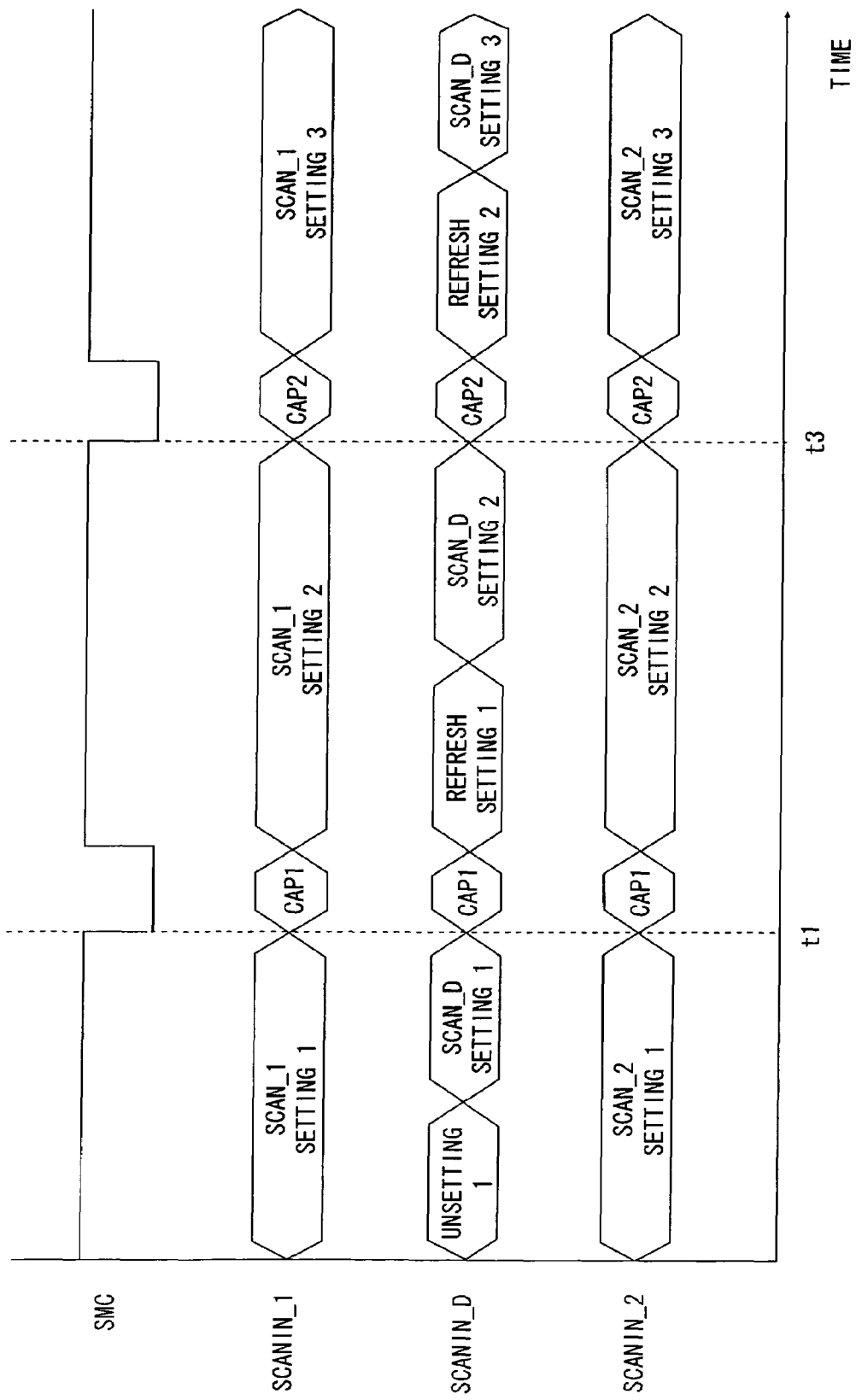
FIG. 11 is a view showing test pattern setting in a circuit of to FIG. 2 according to an embodiment of the present invention.

The test method which is implemented in the test circuit having the configuration of FIG. 2 is described hereinafter with reference to FIGS. 10 and 11. FIG. 10 shows an example of setting when a test pattern is generated for the circuit FIG. 2 according to a normal test pattern generation technique. FIG. 11 shows a test pattern generation technique for the circuit FIG. 2 according to the second embodiment of the present invention.

In FIGS. 10 and 11, "SMC" indicates a waveform of SMC which is a signal for switching between shift mode and capture mode of a scan path. The waveform of SMC is such that "1" represents shift mode and "0" represents capture mode.

The SCANIN_1, SCANIN_D, and SCANIN_2 in FIGS. 10 and 11 indicate the waveforms of SCANIN_1, SCANIN_D, and SCANIN_2 in FIG. 2, respectively.

In FIG. 10, SCAN_1 setting 1, SCAN_1 setting 2, and SCAN_1 setting 3 are the settings of SCANIN_1 and indicate the set values of the first, second and third times of shift mode, respectively. Similarly, SCAN_2 setting 1, SCAN_2 setting 2, and SCAN_2 setting 3 are the settings of SCANIN_2 and indicate the set values of the first, second and third times of shift mode, respectively.

The scan input values of the scan path for setting DRAM are indicated by SCANIN_D. Because the number of flip-flops in the scan path SCANIN_D is half or less than half of the number of flip-flops in the other scan paths, the values are set by SCAN_D setting 1, SCAN_D setting 2, and SCAN_D setting 3, each of which indicates the set values of the first, second and third times of shift mode, respectively.

Though Unsetting 1, Unsetting 2 and Unsetting 3 correspond to the setting in the period which is required for the other scan path, there is no need for setting in the scan path for setting DRAM. Cap1 and Cap2 are settings for capture mode.

Similarly, in FIG. 11, SCAN_1 setting 1, SCAN_1 setting 2, and SCAN_1 setting 3 are the settings of SCANIN_1 and indicate the set values of the first, second and third times of shift mode, respectively. Similarly, SCAN_2 setting 1, SCAN_2 setting 2, and SCAN_2 setting 3 are the settings of SCANIN_2 and indicate the set values of the first, second and third times of shift mode, respectively.

The scan input values of the scan path for setting DRAM are indicated by SCANIN_D. Because the number of flip-flops in the scan path SCANIN_D is half or less than half of the number of flip-flops in the other scan paths, the values are set by SCAN_D setting 1, SCAN_D setting 2, and SCAN_D setting 3, each of which indicates the set values of the first, second and third times of shift mode, respectively, in the case without regard for a refreshing period of DRAM.

Though Unsetting 1, Refresh setting 1 and Refresh setting 2 are not needed for write or read setting, the present invention enables the use of them as the settings for refreshing. Cap1 and Cap2 are settings for capture mode.

The waveform of SCANIN_D in FIGS. 10 and 11 is as follows. Since a test pattern generation generates a test pattern without regard for a refresh period of DRAM, it requires the setting as shown in FIG. 10. If the refresh setting is required, it is inserted between write setting and read setting. As for the values of SCANIN_D, the Unsetting 1, Unsetting 2 and Unsetting 3 are not used for the write setting or the read setting, and therefore the refresh setting can be inserted as shown in Refresh setting 1 and Refresh setting 2 in FIG. 11. Because Refresh setting 1 and Refresh setting 2 are not used for the write setting or the read setting, the refresh setting does not conflict with the write setting or the read setting, thereby enabling easy test pattern generation.

It is apparent that the present invention is not limited to the above embodiment that may be modified and changed without departing from the scope and spirit of the invention. The test circuit according to this invention is adapted not only to a monolithic semiconductor device equipped with DRAM, but also to a hybrid IC and a package equipped with DRAM.

What is claimed is:

1. A test method for writing and reading on a memory to be tested through a scan path flip-flop, comprising:
    writing data to the memory from outside by inputting a write set value to the scan path flip-flop;
    refreshing the data written to the memory by inputting a refresh set value to the scan path flip-flop; and reading the data from the memory and outputting the data to the outside by inputting a read set value to the scan path flip-flop.

2. The test method according to claim 1, wherein the refresh set value is included in a value passing through the scan path flip-flop between the input of the write set value and the input of the read set value.

3. The test method according to claim 1, wherein the input of the refresh set value is performed only when a time period measured from the writing to the memory to the reading from the memory is longer than a data retention period of the memory.

4. The test method according to claim 1, wherein the refresh set value is the same as the read set value, and the refreshing is performed by reading data from the memory.

5. The test method according to claim 1, wherein the refresh set value is a value not affecting test of the memory which is performed by the input of the write set value and the read set value.

6. The test method according to claim 1, wherein the memory is Dynamic Random Access Memory (DRAM).

7. A test circuit for performing testing by shift operation of a plurality of scan paths including a memory test scan path for testing a memory, comprising:
 a plurality of flip-flops included in each of the plurality of scan paths,
 wherein the number of flip-flips included in the memory test scan path is half or less than half of a largest number of flip-flips included in the scan paths.

8. A test method for performing a test by a test circuit including a first scan path comprised of scan path flip-flops mounted to an input and an output of a memory, the test method comprising;
 writing data to the memory from outside by inputting a write set value to the scan path flip-flops that comprise the first scan path;
 refreshing the data written to the memory by inputting a refresh set value to the scan path flip-flops that comprise the first scan path; and
 reading the data from the memory and outputting the data to the outside by inputting a read set value to the scan path flip-flops that comprise the first scan path.

9. The test method according to claim 8, wherein the test circuit comprises a plurality of scan paths including the first scan path, the plurality of scan paths comprises a plurality of flip-flops, and the number of scan flip-flops included in the first scan path is half or less than half of a largest number of flip-flips included in each of the plurality of scan paths, the test method comprising:
 performing shift operation of the plurality of scan paths except the first scan path for a plurality of times while performing shift operation of the first scan path;
 refreshing the memory by at least one time of shift operation of the plurality of times of shift operation and;
 writing/reading data to/from the memory by another shift operation of the plurality of times of shift operation.

10. The test method according to claim 9, wherein the test is performed to a semiconductor integrated circuit including the test circuit and the memory.

11. The test method according to claim 9, wherein the memory is Dynamic Random Access Memory (DRAM).

12. The test method according to claim 8, wherein the test is performed to a semiconductor integrated circuit including the test circuit and the memory.

13. The test method according to claim 8, wherein the memory is Dynamic Random Access Memory (DRAM).

14. A test circuit for performing the test of claim 8, comprising:
 a plurality of scan paths including the first scan path;
 the plurality of scan paths each including a plurality of flip-flops;
 wherein the number of the plurality of flip-flips included in the first scan path is half or less than half of a largest number of flip-flips included in the plurality of scan paths.

15. The test circuit according to claim 14, wherein the test circuit is comprised in a semiconductor integrated circuit including the memory.

16. The test method according to claim 14, wherein the memory is Dynamic Random Access Memory (DRAM).

* * * * *